(12) United States Patent  
Asirvatham et al.

(10) Patent No.: US 7,184,721 B2  
(45) Date of Patent: Feb. 27, 2007

(54) TRANSMIT POWER CONTROL IN A WIRELESS COMMUNICATION DEVICE

(75) Inventors: Kirupairaj Asirvatham, Escondido, CA (US); John R. Rosenlof, La Mesa, CA (US)

(73) Assignee: Texas Instruments Incorporated, Dallas, TX (US)

( * ) Notice: Subject to any disclaimer, the term of this patent is extended or adjusted under 35 U.S.C. 154(b) by 442 days.

(21) Appl. No.: 10/799,849

(22) Filed: Mar. 11, 2004

(65) Prior Publication Data

US 2005/0075085 A1 Apr. 7, 2005

Related U.S. Application Data

(60) Provisional application No. 60/509,080, filed on Oct. 6, 2003.

(51) Int. Cl.
*H03C 1/62* (2006.01)
*H04B 17/00* (2006.01)

(52) U.S. Cl. .................. 455/115.2; 455/127.2
(58) Field of Classification Search ............ 455/67.11, 455/67.14, 115.1, 115.2, 115.3, 126, 127.1, 455/127.2; 375/224; 330/289

See application file for complete search history.

(56) References Cited

U.S. PATENT DOCUMENTS

| 4,992,753 | A | * | 2/1991 | Jenson et al. ............... 330/129 |
| 6,370,364 | B1 | * | 4/2002 | Liimatainen ................ 455/126 |
| 6,711,389 | B2 | * | 3/2004 | Medl et al. .............. 455/127.2 |
| 6,735,420 | B2 | * | 5/2004 | Baldwin ................... 455/127.2 |
| 7,006,824 | B1 | * | 2/2006 | Tse et al. .................... 455/423 |
| 2004/0198261 | A1 | * | 10/2004 | Xiong ..................... 455/115.1 |

OTHER PUBLICATIONS

"Agilent PN 89400-14 Using Error Vector Magnitude Measurements To Analyze And Troubleshoot Vector-Modulated Signals Product Note," 2000, 14 pgs., Agilent Technologies, U.S.A.

* cited by examiner

*Primary Examiner*—Nguyen T. Vo
(74) *Attorney, Agent, or Firm*—Steven A. Shaw; W. James Brady; Frederick J. Telecky, Jr.

(57) ABSTRACT

A method and apparatus permit a wireless communication device to be calibrated during manufacturing and subsequently re-calibrated while in use to correct for the effects of temperature changes on transmit power.

23 Claims, 2 Drawing Sheets

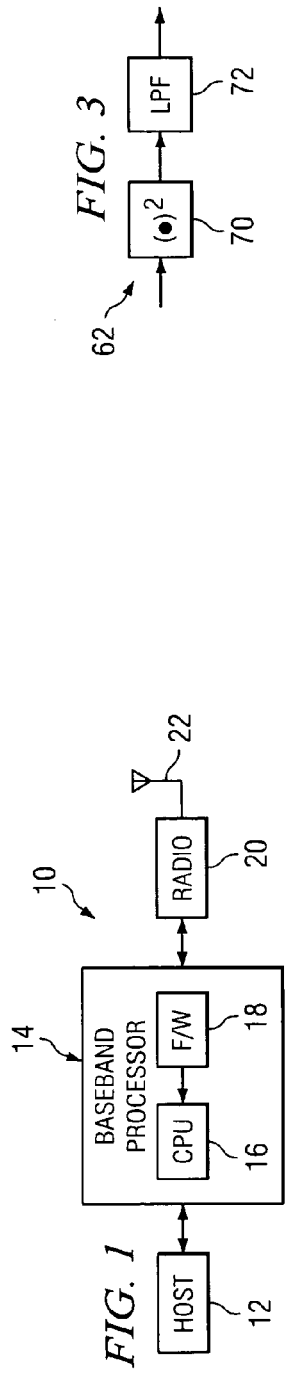
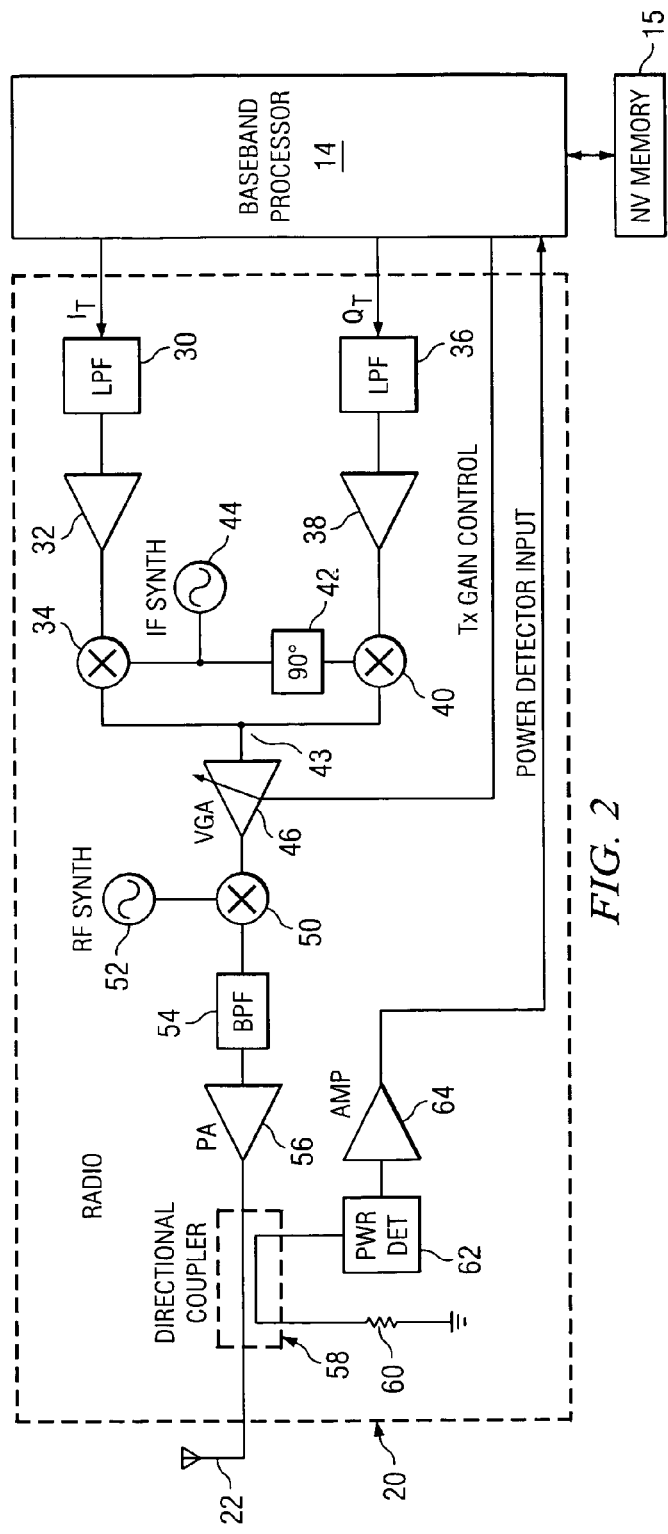

TRANSMIT POWER CONTROL IN A WIRELESS COMMUNICATION DEVICE

PRIORITY CLAIM

This application claims priority to U.S. Provisional Patent Application Ser. No. 60/509,080, filed on Oct. 6, 2003, entitled "WLAN RADIO POWER CONTROL USING A POWER DETECTOR," incorporated herein by reference.

BACKGROUND

1. Technical Field

The present subject matter relates generally to controlling transmit power in a transmitter to account for variations in temperature and frequency.

2. Background Information

Wireless local area network ("WLAN") communication channels typically span a relatively broad range of frequencies in the 2.4 GHz Industry, Scientific and Medical ("ISM") band and the 5 GHz Unlicensed National Information Infrastructure ("U-NII") band. Transmit power of WLAN transmitters may vary with ambient temperature due to thermal characteristics of WLAN chipsets and physical design constraints of the associated WLAN transceiver hardware. When transmitting in different WLAN channels in these bands, it is desirable that the transmit power vary only with the baseband transmit signal levels and not with temperature and channel frequency. In practice, however, transmitter signal power can vary significantly across temperature and radio frequency ("RF") channel frequency. Minimizing transmit power variations to achieve uniform performance and avoid interference to other co-located WLAN networks is desirable.

BRIEF SUMMARY

In accordance with at least some embodiments of the invention, a method and apparatus are disclosed herein that permit a wireless communication device to be calibrated during manufacturing and subsequently re-calibrated while in use to accommodate the effects of temperature changes on transmit power. A preferred embodiment of the manufacturing calibration process comprises determining a first gain setting for a communication device, storing the first gain setting in memory in the communication device, transmitting a calibration signal, changing a second gain setting until transmit power of the communication device is at a predetermined level, obtaining a value indicative of the transmit power, and storing the second gain setting and the value indicative of the transmit power in the communication device's memory. The calibration signal preferably comprises a tone (e.g., a 5 MHz tone) or other constant envelope signal.

A periodic gain adjustment calibration process may comprise retrieving a calibrated gain value from memory in a communication device, changing a gain of an amplifier in the communication device to have the retrieved calibrated gain value, transmitting a calibration signal, measuring transmit power of the communication device while transmitting the calibration signal until the transmit power reaches at least a threshold value, computing a new gain value of the amplifier based on the measured transmit power after the transmit power reaches at least the threshold value, and changing the gain of the amplifier to be the new gain value.

NOTATION AND NOMENCLATURE

Certain terms are used throughout the following description and claims to refer to particular system components. As one skilled in the art will appreciate, various companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to." Also, the term "couple" or "couples" is intended to mean either an indirect or direct connection. Thus, if a first device couples to a second device, that connection may be through a direct connection, or through an indirect connection via other devices and connections.

BRIEF DESCRIPTION OF THE DRAWINGS

For a more detailed description of the preferred embodiments of the present invention, reference will now be made to the accompanying drawings, wherein:

FIG. 1 illustrates a wireless communication device in accordance with the preferred embodiments of the invention;

FIG. 2 depicts a block diagram of a radio transmitter included in the wireless communication device of FIG. 1;

FIG. 3 shows a preferred embodiment of a power detector used in the radio of FIG. 2;

DETAILED DESCRIPTION OF THE PREFERRED EMBODIMENTS

Figure 4:
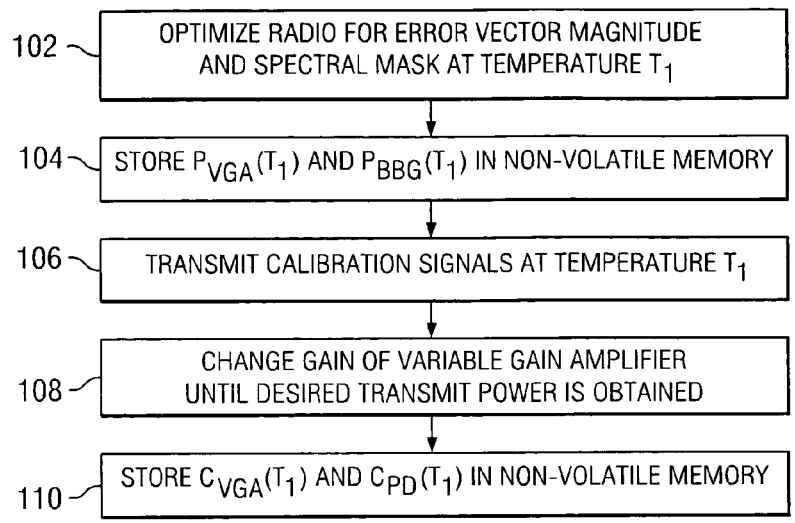
FIG. 4 illustrates a preferred method of calibrating the radio during manufacturing.

The following discussion is directed to various embodiments of the invention. Although one or more of these embodiments may be preferred, the embodiments disclosed should not be interpreted, or otherwise used, as limiting the scope of the disclosure, including the claims, unless otherwise specified. In addition, one skilled in the art will understand that the following description has broad application, and the discussion of any embodiment is meant only to be exemplary, of that embodiment, and not intended to intimate that the scope of the disclosure, including the claims, is limited to that embodiment.

Referring now to FIG. 1, a wireless communication device 10 is shown in accordance with a preferred embodiment of the invention. The wireless device 10 may comprise, for example, a wireless transceiver used in a WLAN. As shown, the wireless communication device comprises a host 12, a baseband processor 14 and a radio 20. One or two antennas 22 coupled to the radio 20 facilitate one or two-way wireless communications between the device 10 and another device (not shown). The host 12 generally comprises application-specific functionality. In some embodiments, the host may comprise a personal data assistant or a computer such as a wireless-enabled laptop computer. The baseband processor 14 and radio 20 may be fabricated on a circuit card that may be inserted into the computer to permit the computer to wirelessly access a wireless local area network.

Referring still to FIG. 1, the baseband processor 14 comprises a central processing unit ("CPU") 16 that executes firmware 18 stored in non-volatile memory. At least some of the functionality described herein may be performed by the CPU 16 executing the firmware 18. The baseband processor 14 also implements a baseband amplifier (not separately shown) which functions to amplify signals being transmitted via radio 20 and antenna 22.

FIG. 2 depicts an example of a WLAN transmitter and shows additional detail for the radio transmitter 20. As shown, the radio comprises two processing paths for the I and Q components of the transmitted signal. The I path comprises low pass filter 30, amplifier 32, and mixer 34 while the Q path comprises low pass filter 36, amplifier 38, and mixer 40. The mixers 34 and 40 multiply their respective signals by a signal from a signal generator 44 (the Q path including a 90 degree phase shifter for the signal generator output signal). The output signals from the multipliers are summed together at node 43 to form an intermediate frequency (IF) signal, which is provided to a variable gain amplifier ("VGA") 46. The amount of gain implemented in the VGA 46 is controlled by the baseband processor via the transmit gain control signal.

An RF mixer 50 multiplies the output signal from the VGA 46 by a signal from an RF synthesizer to upshift the transmit signal to a suitable carrier frequency for transmission. The radio also comprises a band pass filter 54 followed by a power amplifier 56. The antenna 22 couples to the output of the power amplifier through a directional coupler. The power detector 62 is operatively coupled to the directional coupler 58 to determine the power level of transmitted signal. The directional coupler 58 suppresses energy reflected back to the power amplifier from the antenna so that the power detector measures only the transmit power. A power detector 62 comprises a circuit that outputs a signal indicative of the level of transmit power. An exemplary embodiment of the power detector 62 is shown in FIG. 3 as a squaring circuit 70 followed by a low pass filter 72. Referring still to FIG. 2, the output signal from the power detector is provided to an amplifier 64 and then to the baseband processor 14 for further processing as described herein. FIG. 2 also shows a non-volatile memory 15 coupled to, or otherwise accessible to, the baseband processor 14. The non-volatile memory 15 may comprise a re-programmable read only memory such as an electrically erasable read only memory ("EEPROM") or battery-backed random access memory ("RAM"). The non-volatile memory 15 preferably is used to store various parameters used, as described below, in a closed loop power control ("CLPC") algorithm implemented at least in part by the CPU 16 of the baseband processor 14 and associated firmware 18. Those skilled in the art will appreciate various types of transmitter architectures that can implement CLPC based on the teachings contained herein.

Figure 5:
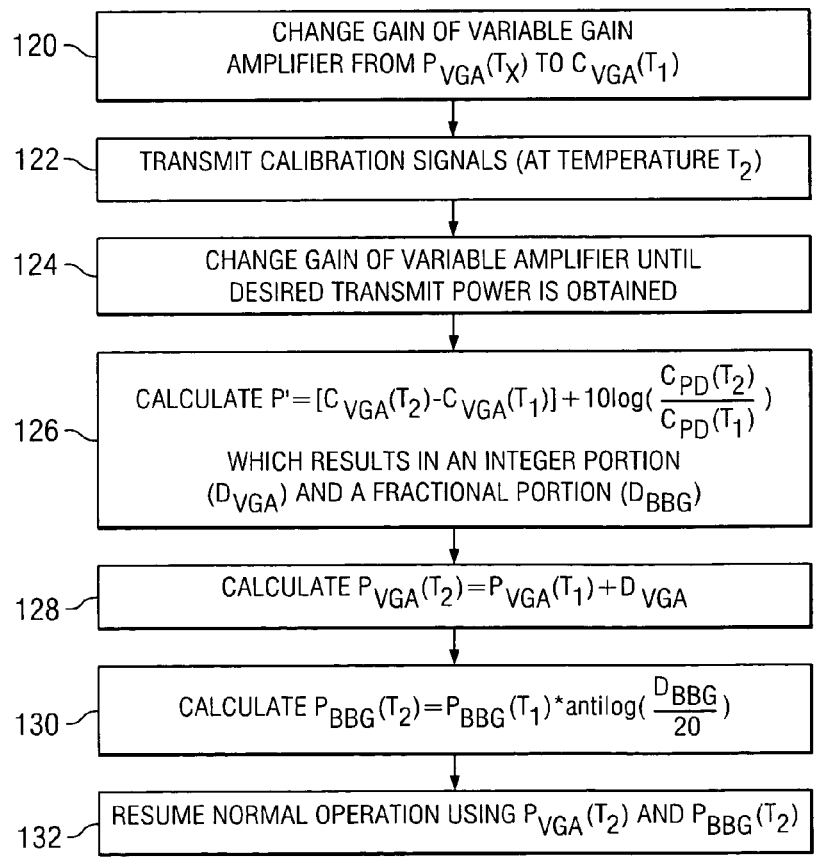
FIG. 5 illustrates a method of calibrating the radio during normal device operation to adjust for changes in temperature.

The CLPC algorithm generally comprises two processes. A first process includes a calibration process preferably performed during fabrication of the radio. This calibration process generally is performed once per radio. A second process generally comprises a repeatedly executed calibration process while the radio is being used during normal operation to transmit data. FIG. 4 illustrates a preferred embodiment of the initial calibration process and FIG. 5 illustrates a preferred embodiment of the repeatedly executed calibration process.

Turning now to FIG. 4, the initial calibration process comprises blocks 102, 104, 106, 108, and 110 as shown. In block 102, the radio is optimized for error vector magnitude ("EVM") and spectral mask at a first temperature $T_1$. The temperature $T_1$ can be any suitable and controlled temperature. Any suitable mechanism for optimizing the radio for EVM and spectral mask is acceptable such as that described in "Using Error Vector Magnitude measurements to Analyze and Troubleshoot Vector-Modulated Signals" by Agilent Technologies, copyright 1997, 2000, incorporated herein by reference. As a result of the optimization process depicted by block 102, optimal gain settings are determined for the VGA 46 and the baseband amplifier in the baseband processor. These gain settings are referred to as $P_{VGA}(T_1)$ (represented in dB) and $P_{BBG}(T_1)$ where the parenthetical reference to "$T_1$" indicates that the VGA and baseband amplifier gain settings are determined at the temperature $T_1$. In block 104, the values of $P_{VGA}(T_1)$ and $P_{BBG}(T_1)$ are stored in the non-volatile memory 15.

At 106, the baseband processor 14 causes a calibration signal to be transmitted via the radio 20. The calibration signal preferably comprises a tone (e.g., a 5 MHz tone) or other constant envelope signal. Preferably, the calibration signal is transmitted relatively soon after the baseband processor determines that the transmit power is satisfactory to ensure that the calibration signal captures the temperature environment in which the manufacturing calibration is performed. At 108, the baseband processor assesses the transmit power level via the power detector 62 and changes the gain of the VGA 46 until a desired transmit power is obtained. In accordance with the preferred embodiment of the invention, the desired transmit power is greater than 0 dBm and generally within a predetermined range of values. In some embodiments, the calibration process of FIG. 4 is performed for each of a plurality of frequency bands. For example, one frequency band comprises 2.412–2.484 GHz (channels 1–14). Another band may comprise 5.18–5.32 GHz (channels 36–64) while other bands may comprise 5.5–5.6 GHz (channels 100–120) and 5.62–5.805 GHz (channels 124–161). The choice of the frequency bands on which the calibration is performed is determined based on the nature of the radio 20. The CLPC algorithm places no restriction on the number of frequency bands except that the algorithm preferably is performed on each of these bands independently. As such, the desired transmit power referred to in block 108 is chosen so that the power detector returns reliable temperature compensated values. This may be about 7 dBm for the channels in the 5 GHz bands and about 4 dBm for the channels in the 2.4 GHz bands. In block 110, the new gain setting of the VGA and the transmit power associated with the new VGA setting, referred to as $C_{VGA}(T_1)$ (represented in dB) and $C_{PD}(T_1)$, respectively, are also stored in the non-volatile memory 15.

During normal operation, the wireless communication device 10 transmits data according to the requests of the host 12. During periodic intervals (e.g., every five minutes), the baseband processor 14 causes the device 10 to transition to a calibration mode in which the process of FIG. 5 is performed. When the periodic calibration mode depicted in FIG. 5 is performed, the ambient temperature at which the wireless communication device operates may be different from the initial calibration temperature $T_1$. The temperature of the periodic calibration mode is referred to as $T_2$ in FIG. 5. The temperature $T_2$ may be the same or different as the temperature $T_1$. The periodic calibration mode of FIG. 5 recomputes the gain settings for the VGA 46 and the baseband amplifier in accordance with changes in temperature.

At block 120, the baseband processor 14 causes the gain setting for the VGA to be changed from its setting usable to transmit data packets ($P_{VGA}(T_1)$) to the value of $C_{VGA}(T_1)$. AT 122, the baseband processor 14 causes the calibration signal (in some embodiments the same calibration signals referred in FIG. 4), to be transmitted. The baseband processor 14 then changes at 124 the gain of the VGA until the desired transmit power is obtained in a process similar to that of block 108 in FIG. 4.

A series of calculations are performed by the baseband processor as reflected in blocks 126, 128, and 130. In block 126, the baseband processor computes the value of $$P' \text{ as } P' = [C_{VGA}(T_2) - C_{VGA}(T_1) + 10\log\left(\frac{C_{PD}(T_2)}{C_{PD}(T_1)}\right)].$$

The value P' is a dB representation containing an integer portion and a fractional portion. The integer portion is referred to as $D_{VGA}$ and the fractional portion is referred to as $D_{BBG}$. Thus, if P' is represented as xx.yy, the value of xx is $D_{VGA}$ and the value of yy is $D_{BBG}$. In block 128, the new VGA gain setting for normal data packet transmission preferably is computed as $P_{VGA}(T_2)=P_{VGA}(T_1)+D_{VGA}$. In block 130, the new baseband amplifier gain setting preferably is computed as $$P_{BBG}(T_2) = P_{BBG}(T_1)\text{antilog}\left(\frac{D_{BBG}}{20}\right).$$

The values of $D_{VGA}$ and $D_{BBG}$ represent correction factors usable to correct the VGA and baseband gain settings for the effects of changes in temperature. Finally, in block 132, with the new gain settings computed, normal operation of the wireless communication device 10 resumes.

While the preferred embodiments of the present invention have been shown and described, modifications thereof can be made by one skilled in the art without departing from the spirit and teachings of the invention. The embodiments described herein are exemplary only, and are not intended to be limiting. Accordingly, the scope of protection is not limited by the description set out above.

What is claimed is:

1. A method, comprising:
    determining a first gain setting for a communication device optimized for error vector magnitude;
    storing said first gain setting in memory in the communication device;
    transmitting a calibration signal;
    changing a second gain setting until transmit power of the communication device is at a predetermined level;
    obtaining a value indicative of the transmit power; and
    storing the second gain setting and the value indicative of the transmit power in the communication device's memory.

2. The method of claim 1 wherein transmitting the calibration signal comprises transmitting a tone or other constant envelope signal.

3. The method of claim 1 wherein obtaining the value indicative of the transmit power comprises measuring transmit power of the communication device while transmitting said calibration signal.

4. The method of claim 1 further comprising periodically transmitting the calibration signal, measuring transmit power, and adjusting a gain of an amplifier in the communication device based on the measurement of the transmit power.

5. The method of claim 4 wherein periodically adjusting the gain of the amplifier comprises adjusting the gain until the transmit power reaches at least a threshold value.

6. The method of claim 4 wherein determining the first gain setting occurs at an ambient temperature that is different from an ambient temperature at which the calibrator signals are periodically transmitted.

7. A method, comprising:
    retrieving a calibrated gain value from memory in the communication device which has been optimized for error vector magnitude;
    changing a gain of an amplifier in the communication device to have the retrieved calibrated gain value;
    transmitting a calibration signal;
    measuring transmit power of the communication device while transmitting the calibration signal until the transmit power reaches at least a threshold value;
    computing a new gain value of the amplifier based on the measured transmit power after the transmit power reaches at least the threshold value; and
    changing the gain of the amplifier to be the new gain value.

8. The method of claim 7 further comprising transmitting data packets with the amplifier having the new gain value.

9. The method of claim 7 wherein transmitting the calibration signal comprises transmitting a tone or other constant envelope signal.

10. A wireless communication device, comprising:
    a baseband processor;
    an antenna;
    a radio coupled to the antenna and the baseband processor, said radio containing a variable gain amplifier and a power detector that measures transmit power of the communication device;
    wherein, after the radio is optimized for error vector magnitude, the baseband processor causes the radio to transmit a calibration signal, change a gain value of the variable gain amplifier until transmit power of the communication device is within a predetermined range.

11. The wireless communication device of claim 10 wherein the baseband processor causes the radio to change the gain value, emit the calibration signal and determine the new gain value at periodic intervals during a calibration mode of the wireless communication device.

12. The wireless communication device of claim 10 wherein the baseband processor causes the radio to change the gain value of the variable gain amplifier until the transmit power is within a predetermined range.

13. The wireless communication device of claim 10 wherein the baseband processor computes a correction factor to be used to determine the new gain value, the correction factor is a function of the power measurement.

14. The wireless communication device of claim 10 wherein the calibration signal comprises a tone or other constant envelope signal.

15. The wireless communication device of claim 10 wherein the gain value at which the transmit power is within the predetermined range and a value indicative of the transmit power are stored in non-volatile memory in the wireless communication device.

16. The wireless communication device of claim 10 wherein, at periodic intervals during while transmitting data packets, the baseband processor changes a gain value of the variable gain amplifier to a previously stored calibration gain value, causes a calibration signal to be emitted, and determines a new gain value for the variable gain amplifier based on a power measurement made while emitting the calibration signal.

17. The wireless communication device of claim 10 wherein the calibration signal comprises a tone or other constant envelope signal.

18. A storage medium in which code is stored, said code being adapted to be executed by a central processing unit ("CPU") and, when accessed by a CPU, causes the CPU to:
   determine a first gain setting for a communication device by calibrating the communication device for error vector magnitude;
   store said first gain setting in memory in the communication device;
   transmit a calibration signal;
   change a second gain setting until transmit power of the communication device is at a predetermined level;
   obtain a value indicative of the transmit power; and
   store the second gain setting and the value indicative of the transmit power in the communication device's memory.

19. The storage medium of claim 18 wherein the calibration signal comprises a tone or other constant envelope signal.

20. The storage medium of claim 18 wherein the code causing the CPU to obtain the value indicative of the transmit power comprises causing the CPU to measure transmit power of the communication device while transmitting said calibration signal.

21. The storage medium of claim 18 wherein the code also causes the CPU to periodically transmit the calibration signal, measure transmit power, and adjust a gain of an amplifier in the communication device based on the measurement of the transmit power.

22. A storage medium in which code is stored, said code being adapted to be executed by a central processing unit ("CPU") and, when accessed by a CPU, causes the CPU to:
   retrieve a calibrated gain value from memory in a communication device optimized for error vector magnitude;
   change a gain of an amplifier in the communication device to have the retrieved calibrated gain value;
   transmit a calibration signal;
   measure transmit power of the communication device while transmitting the calibration signal until the transmit power reaches at least a threshold value;
   compute a new gain value of the amplifier based on the measured transmit power after the transmit power reaches at least the threshold value; and
   change the gain of the amplifier to be the new gain value.

23. The storage medium of claim 22 wherein the code also causes the CPU to transmit data packets with the amplifier having the new gain value.

* * * * *